(12) United States Patent
Satsu et al.

(10) Patent No.: US 7,220,481 B2
(45) Date of Patent: May 22, 2007

(54) HIGH DIELECTRIC CONSTANT COMPOSITE MATERIAL AND MULTILAYER WIRING BOARD USING THE SAME

(75) Inventors: Yuichi Satsu, Hitachi (JP); Akio Takahashi, Hitachiohta (JP); Tadashi Fujieda, Mito (JP); Takumi Ueno, Mito (JP); Haruo Akahoshi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 806 days.

(21) Appl. No.: 10/062,562

(22) Filed: Feb. 5, 2002

(65) Prior Publication Data

US 2002/0168510 A1 Nov. 14, 2002

(30) Foreign Application Priority Data

Feb. 8, 2001 (JP) .............................. 2001-031693

(51) Int. Cl.
   - *B32B 27/20* (2006.01)
   - *B32B 33/00* (2006.01)
   - *C08K 3/08* (2006.01)
   - *C08K 5/00* (2006.01)

(52) U.S. Cl. ....................... 428/328; 428/221; 428/323; 428/327; 428/332; 428/402; 428/403; 428/407; 428/409; 524/81; 524/401; 524/403; 524/406; 524/407; 524/413; 524/434; 524/435; 524/436; 524/437; 524/438; 524/439; 524/440; 524/441

(58) Field of Classification Search ..................... None
See application file for complete search history.

(56) References Cited

U.S. PATENT DOCUMENTS 5,856,395 A * 1/1999 Tanisho et al. .............. 524/413
5,962,122 A * 10/1999 Walpita et al. .............. 428/325
6,068,782 A   5/2000 Brandt et al.
6,544,651 B2 * 4/2003 Wong et al. ................. 428/413
2002/0039667 A1 * 4/2002 Takaya et al. .............. 428/692

FOREIGN PATENT DOCUMENTS

| EP | 03254011 | 11/1991 |
| EP | 0 537 371 | 4/1993 |
| EP | 1 150 311 | 10/2001 |
| JP | 6-172618 | 6/1994 |

OTHER PUBLICATIONS

"Integrated Capacitors Using Polymer-Ceramic Composites for MCM-L", Premjeet Chahal et al., ISHM '96 PROCEEDINGS, pp. 126-131.

(Continued)

*Primary Examiner*—Michael J. Feely
(74) *Attorney, Agent, or Firm*—McDermott Will & Emery LLP

(57) ABSTRACT

A high dielectric composite material obtained by subjecting submicron particles of an inorganic filler containing a metal as its essential component to an insulating treatment such as a chemical treatment, further subjecting to a surface treatment for improving their compatibility with organic resins, and then dispersing in an organic resin, has a dielectric constant of 15 or above, with its dielectric loss tangent in the frequency region of from 100 MHz to 80 GHz being 0.1 or less, and can therefore be used effectively for multilayer wiring boards and module substrates.

7 Claims, 7 Drawing Sheets

OTHER PUBLICATIONS

"Effective Dielectric Constant Prediction of Polymer-ceramic Composite Based on Self-consistent Theory", Yang Rao et al., 2000 Electronic Components and Technology Conference, pp. 615-618.

"$SiO_2$ Film by ECR-CVD for Thin-Film Capacitors Directly Fabricated on Epoxy/Glass Printed Wiring Boards", Teruhito Matsui et al., Circuit Technology, vol. 9, No. 7, pp. 497-502.

* cited by examiner

HIGH DIELECTRIC CONSTANT COMPOSITE MATERIAL AND MULTILAYER WIRING BOARD USING THE SAME

BACKGROUND OF THE INVENTION

The present invention relates to a high dielectric constant material used for multilayer wiring boards having a built-in passive element capacitor, and a multilayer wiring board and a module substrate using the said material.

In order to realize high-density surface packaging, many studies have been made for reducing the size of via holes, narrowing down wiring pitch, establishing the build-up system, etc., in the manufacture of the substrates. Efforts have also been made for miniaturization of IC packages, multiplication of pins, miniaturization and surface packaging of the passive parts such as condensers and resistors. On the other hand, with the progress of miniaturization of the passive elements, there arose a problem in that their handling became more difficult in the manufacture and packaging thereof, and the limitation of the conventional technology in this line has become apparent. As a solution to this problem, it has been proposed to form the passive elements directly on the surface or in the inside of a printed wiring board. This makes it unnecessary to mount the passive element chip parts on the printed wiring board, conducing to realize high-density packaging and an enhancement of reliability. The conventional coating and sintering techniques using a paste of a metal or an insulator, such as practiced with the ceramic substrates, can not be directly applied to the other types of substrates, especially organic substrates which are low in heat resistance.

As means for forming the passive elements such as mentioned above on an organic substrate, there have already been proposed the methods comprising coating the substrate with a mixture of an organic polymer and a high dielectric filler (P. Chanel et al, 46th Electric Components and Technology Conference, pp. 125–132, 1996; Y. Rao et al, 2000 Electric Components and Technology Conference, pp. 615–618, 2000), a technique for elevating the packing rate of an inorganic filler such as barium titanate (JP-A-6-172618), and a method using ECR-CVD (electronic cycloton resonance chemical vapor deposition) which is capable of film forming at low temperature (T. Matsui et al, Circuit Technology, Vol. 9, pp. 497–502, 1994).

It is necessary to raise the filler loading for elevating the dielectric constant of the filler applied as a composite with an organic resin. High loading of an inorganic filler in a resin, however, tends to cause formation of voids when the resin is cured, due to bad compatibility of inorganic fillers with resins. Further, because of low interfacial adhesion between inorganic filler and resin, there tends to take place separation at the interface. Therefore, use of a resin composite with high inorganic filler loading as an insulating material raises the concern that reliability be lowered in relation to dielectric strength or leakage current.

Also, the method using ECR-CVD has problems in that a specific apparatus must be used, that it is impossible to form the dielectric films at low cost by a batch process, and that it is difficult to form a dielectric film having a complicate configuration.

On the other hand, as means for increasing the dielectric constant, a method is suggested in which a metal power having an average particle size of not less than several ten μm, which is the standard size of metal powders, is filled in an organic resin. Although such a composite material shows a satisfactory dielectric constant of not less than several ten, it suffers a dielectric loss tangent of not smaller than 0.1 due to skin effect, and more seriously, such an organic resin/metal composite is very low in insulating performance. Further, miscibility of organic resin with metal is bad like inorganic materials.

SUMMARY OF THE INVENTION

An object of the present invention is to provide a high dielectric constant composite material having a volume resistivity of $10^9$ Ω or higher and also maintaining a high dielectric constant of 15 or above and a low dielectric loss tangent of 0.1 or below even in the high frequency region of several tens GHz order, and a multilayer wiring board using such a composite material.

Another object of the present invention is to provide a high dielectric constant composite material compounded with an organic resin capable of forming a passive element directly on a surface or interior of a printed wiring board, and good in processability, and a multilayer printed wiring board using the same.

The present invention provides a high dielectric constant composite material having a dielectric constant of 15 or above, comprising an organic resin and, dispersed therein, an inorganic filler containing a metal powder as an essential component.

Other objects, features and advantages of the invention will become apparent from the following description of the embodiments of the invention taken in conjugation with the accompanying drawings.

DETAILED DESCRIPTION OF THE INVENTION

Figure 1:
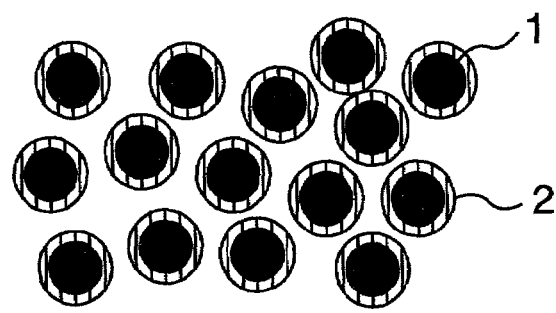
FIG. 1 is a sectional view of the particles of metal powder after the insulation treatment in the first and second embodiments of the present invention.

In order to attain the above object, it is essential to use metal powder which suffers no energy loss due to skin effect even at a high frequency of several tens GHz order, and it is important therefor that the size of the metal powder is submicron, and that insulation is secured for every particle of metal powder. There are available various methods for insulation treatment of the individual particles of metal powder, but a chemical treatment with an inorganic salt such as phosphates or chromates is most effective. This is for the reason that an insulation layer of an inorganic salt is formed on the particle surfaces of metal powder by this treatment. This insulating film has higher anti-heat and anti-moisture reliability than other types of insulating film.

For raising dielectric constant of an organic resin-based composite material, it is imperative to increase loading of said metal powder in the organic resin, for which it is essential to improve compatibility between said metal powder and organic resin. An effective means for attaining this is the coupling treatment which is capable of forming a chemical bond between the metal surface and the insulation layer thereon as well as a chemical bond with the organic resin, too.

The characteristic features of the present invention are described below.

The first feature of the present invention is that a high dielectric constant composite material having a dielectric constant of 15 or above, comprising an organic resin and, dispersed therein, an inorganic filler containing a metal powder as its essential component, is provided.

The second feature of the present invention is that this high dielectric constant material suffers a dielectric loss tangent of only 0.1 or less in the frequency region of from 100 MHz to 80 GHz.

It was further disclosed by the present invention that for restricting the dielectric loss tangent to 0.1 or less in the frequency region of from 100 MHz to 80 GHz, it is necessary that every component in the inorganic filler containing a metal powder as essential component has an average particle size of 5 μm or less. Here, an inorganic filler comprising a metal oxide may be added for preventing sedimentation of the metal powder in the resin varnish. It is also effective to use a composite material in which the particle size of the metal powder was restricted to submicron by complexing of an inorganic filler comprising a metal powder and the one comprising a material other than metal powder.

It is an important technique for minimizing the dielectric loss tangent in the high frequency region and securing the required insulating properties to use an inorganic filler having as essential component a metal powder which has been surface treated to form an oxide film or which has been subjected to an insulation treatment by a suitable method such as coating with an organic resin. Implementation of this technique is the fourth feature of the present invention. It is even more effective to jointly use a metal oxide for satisfying both requirements for high dielectric constant and required insulating performance. For this, a method may be employed in which the metal powder is coated with a metal oxide.

By virtue of this insulating treatment or coating with a metal oxide, the high dielectric composite material of the present invention has a volume resistivitiy of $10^9$ Ω cm or above and is suited for use as substrates for electronic devices.

The inorganic filler containing a metal powder as its essential component may include agglomerates thereof having an average particle size of 5 μm or less.

The metals usable as metal powder in the present invention include the elements of Groups 1B, 2B, 3B, 4B, 5B, 6B, 7B, 8, 2A, 3A, 4A and 5A (excluding boron, carbon, nitrogen, phosphorus and arsenic) of the Periodic Table and their alloys, for instance, Al, Mn, Si, Mg, Cr, Ni, Nb, Mo, Cu, Fe, W, Zn, Sn, Pb, Ag, Ti, Zr, Ta, Pt, Sb, and their alloys.

The metal powder may have a metallic covering such as electric plated film the surface thereof with a thickness of 1000 to 1 nm using at least one metal selected from Cr, Cd, Zn, Mn and Fe.

The organic resins applicable in the present invention include thermosetting resins such as epoxy resins, phenol resins, bismaleimide resins and cyanate resins, thermoplastic resins such as polyimide resins, polyphenylene oxide and polyphenylene sulfide, and mixtures thereof. If desired, such an organic resin may be dispersed in a solvent such as methyl ethyl ketone, isopropyl alcohol or methyl Cellosolve to form a paste or a dispersion, which is subjected to screen printing or spin coating to form a high dielectric constant layer.

As another feature of the present invention, a composite material comprising an organic resin and, dispersed therein, an inorganic filler having as essential component a metal powder which has been subjected to a surface insulation treatment and coupling treatment (or surface treatment) is used for the capacitor in a multilayer wiring board in which a capacitor having a dielectric layer interposed between the electrodes is formed in the circuit, to thereby provide a multilayer wiring board having a built-in condenser with a large electrical capacitance.

As still another feature of the present invention, a composite material comprising an organic resin and, dispersed therein, an inorganic filler having as essential component a metal powder subjected to insulation and coupling treatments on the surface is used for the capacitor in a module substrate in which a capacitor having a dielectric layer interposed between the electrodes is formed in the circuit, to provide a module substrate having a built-in condenser with a large electrical capacitance.

The present inventors found that for obtaining a composite material containing an organic resin and having a dielectric constant of 25 or greater and a dielectric loss tangent of 0.1 or less even at a frequency of several tens GHz order, it is expedient to apply a chemical insulation treatment with an inorganic salt and to fill in the organic resin a metal powder of a submicron size which has been subjected to a coupling treatment.

Use of a metal powder of a submicron size is intended to minimize the dielectric loss tangent due to skin effect at a frequency of the several tens GHz order. It is for the same reason that securing of insulating performance of the individual particles of metal powder by the chemical treatment using an inorganic salt is important. The coupling treatment on the metal powder which has been subjected to an insulation treatment is conducted as it is imperative to improve compatibility with the resin used. This treatment is schemed not only to increase metal powder loading in the resin but also to improve workability of the mixture and inhibit sedimentation of the metal powder.

As a result of the metal powder insulation treatment, the produced high dielectric constant composite material incorporating an organic matter has a volume resistivity of $10^9$ Ω cm or higher.

The effect of the present invention is described below more definitely with reference to the Examples thereof.

EXAMPLE 1

A process for producing a high dielectric constant composite material according to the first embodiment of the present invention is explained below. In this Example, EP828 (produced by Yuka Shell Epoxy Co., Ltd.) was used as epoxy resin, m-phenylenediamine (produced by Wako Pure Chemical Industries, Ltd.) as epoxy resin curing agent, and 2E4MZ-CN (produced by Shikoku Chemicals Corp.) as curing accelerator. Iron powder having an average particle size of 0.5 μm was used as a starting material for the high dielectric constant composite material. For the insulation of iron powder, a phosphate-based chemical treating solution containing 0.4 mol/l of benzotriazole as rust inhibitor and 0.1% by weight of EF104 (produced by Tohchem Products Corp.) as surfactant was used. S510 (produced by Chisso Corp.) was used as surface treating solution for the insulated iron powder.

(1) To 1 kg of iron powder having an average particle size of 0.5 μm, 200 ml of the insulating treatment solution was added and the mixture was stirred by a V mixer for 30 minutes, followed by heat treatment at 180° C. for 60 minutes. A sectional view of the iron powder particles after the insulation treatment is shown in FIG. 1. As seen from FIG. 1, the surface of iron powder 1 is coated with an insulating film 2 after the insulation treatment.

Figure 2:
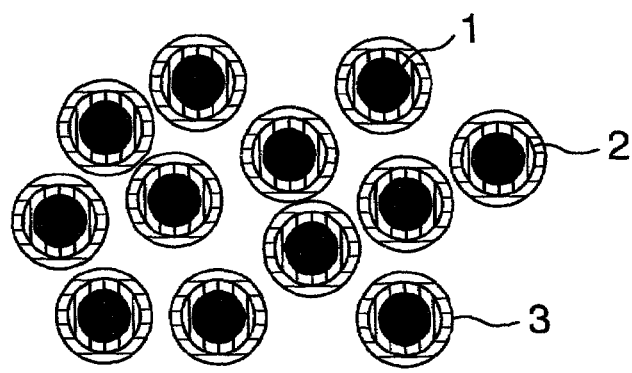
FIG. 2 is a sectional view of the particles of metal powder after the surface treatment in the first and second embodiments of the present invention.

(2) The iron powder which has undergone the insulation treatment of (1) above was then subjected to a surface treatment with an S510 solution diluted to 1 wt % concentration with a water/methanol mixed solvent, under the conditions of 150° C. and one hour. A sectional view of the iron powder after the surface treatment is shown in FIG. 2. It will be seen that after the surface treatment, the insulating film 2 around iron powder 1 is further coated with a surface treatment film 3.

(3) The iron powder subjected to the surface treatment in (2) above was added to a liquid epoxy resin EP828 in such an amount that would make the iron powder 50% by volume, and the mixture was kneaded by a three-roll mill. To the kneaded mixture, m-phenylenediamine was added in an amount making it equivalent to the epoxy resin in relation to the curing reaction, followed by further addition of 2E4MZ-CN in an amount of 0.5 part by weight based on the epoxy resin, and the mixture was kneaded by a three-roll mill.

Figure 3:
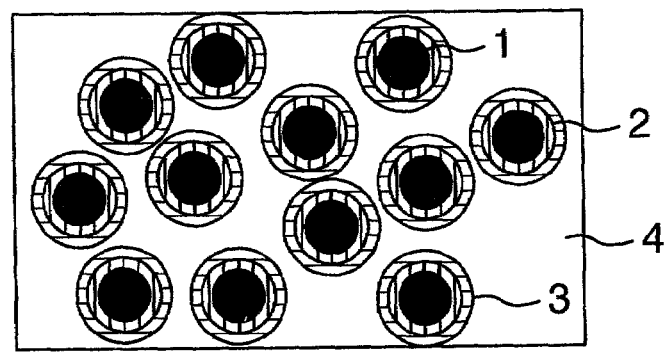
FIG. 3 is a sectional view of the high dielectric constant composite material in the first and second embodiments of the present invention.

(4) The mixture obtained in (3) was heated and cured at 80° C. for 4 hours and then at 180° C. for 4 hours to obtain a high dielectric constant composite material of the present invention. A sectional view of this high dielectric constant composite material is shown in FIG. 3. The high dielectric constant composite material of this Example is of a structure in which an inorganic filler comprising metal powder 1 having its surface coated with an insulation layer 2, said insulation layer 2 being in turn coated with a surface treatment layer 3, is dispersed in an organic resin 4.

The dielectric constant and dielectric loss tangent of the high dielectric constant composite material of this Example of the present invention are explained below. For the measurement in the frequency region of 100 MHz to 80 GHz, there were used test pieces obtained from the above high dielectric constant composite material worked into a toroidal shape measuring 7 –0.05 mm in external diameter, 3.04+ 0.06 mm in inner diameter and 2 mm or 4 mm in thickness. For determining the dielectric constant and dielectric loss tangent of the sample by a determination system comprising a network analyzer (HP 8720C) and coaxial air line, calibration was made so that the dielectric constant of the free space would become 1, then the sample was inserted in the coaxial air line and determination was made using two ports. For the measurement in the frequency region of 5 GHz to 10 GHz, there were used test pieces obtained from the high dielectric constant composite material worked into a square pillar of 1 mm×1 mm×100 mm, and for the measurement in the frequency region of 20 GHz to 40 GHz, there were used test pieces of film-form test pieces with 100 μm thick. The measurement was carried out by a cavity resonance method using 8722 ES Network Analizzer manufactured by Agilent Technology Co.

For determination of volume resistivity of the said high dielectric composite material, the electrodes having a main electrode external diameter of 50 mm, a guard electrode inner diameter of 52 mm, its external diameter of 80 mm and an opposite electrode external diameter of 80 mm were formed on a resin plate made of the said high dielectric composite material, and volume resistivity was determined by an LIC meter (HP4248A) at a frequency of 100 kHz. The results are shown in Table 1.

TABLE 1

| High dielectric constant material | Size (μm) | Insulation treatment | Surface treatment | Dielectric constant (0.1–40 GHz) | Dielectric loss tangent | Volume resistivity (Ω cm) |
| --- | --- | --- | --- | --- | --- | --- |
| Example 1 Iron | 0.5 | Conducted | Conducted | 90–60 | 0.1–0.04 | $1 \times 10^{14}$ |
| Example 2 Zinc | 0.5 | Conducted | Conducted | 90–70 | 0.08–0.04 | $5 \times 10^{13}$ |
| Example 3 Zinc | 3 | Conducted | Conducted | 60–30 | 0.1–0.05 | $3 \times 10^{13}$ |

TABLE 1-continued

| | High dielectric constant material | Size (μm) | Insulation treatment | Surface treatment | Dielectric constant (0.1–5 GHz) | Dielectric loss tangent | Volume resistivity (Ω cm) |
|---|---|---|---|---|---|---|---|
| Example 4 | Zinc (agglomerate) | 0.1 (5) | Conducted | Conducted | 40–15 | 0.1–0.07 | 6 × 10¹³ |
| Example 5 | Copper (Cr plating thickness) | 1 (0.01) | Conducted | Conducted | 90–70 | 0.08–0.05 | 1 × 10¹⁴ |
| Example 6 | Cr—Al₂O₃ | 1, 0.1 | Conducted | Conducted | 80–40 | 0.08–0.04 | 2 × 10¹⁴ |
| Example 7 | Fe—Al₂O₃ | 0.2 | Conducted | Conducted | 70–30 | 0.08–0.03 | 3 × 10¹⁴ |
| Example 8 | Fe—BaTiO₃ | 0.2 | Conducted | Conducted | 75–30 | 0.1–0.05 | 2 × 10¹⁴ |
| Comp. Example 1 | Iron | 5 | Conducted | Conducted | 55–15 | 0.8–0.08 | 2 × 10¹³ |
| Comp. Example 2 | Zinc | 0.5 | Not Conducted | Conducted | 90–30 | 0.8–0.1 | 5 × 10³ |
| Comp. Example 3 | Zinc | 20 | Conducted | Conducted | 20–13 | 0.5–0.2 | 1 × 10¹³ |
| Comp. Example 4 | Zinc (agglomerate) | 0.1 (50) | Conducted | Conducted | 20–12 | 0.5–0.1 | 2 × 10¹³ |
| Comp. Example 5 | Copper (Cr plating thickness) | 1 (0.01) | Not Conducted | Conducted | 80–30 | 0.8–0.1 | 1 × 10⁴ |
| Comp. Example 6 | Cr—Al₂O₃ | 1, 0.1 | Conducted | Not Conducted | — | — | — |
| Comp. Example 7 | Fe—Al₂O₃ | 10 | Conducted | Conducted | 65–20 | 0.8–0.15 | 5 × 10¹³ |
| Comp. Example 8 | Fe—BaTiO₃ | 0.2 | Not Conducted | Conducted | 75–30 | 0.7–0.1 | 1 × 10⁵ |

Note) — : impossible to make test pieces

EXAMPLE 2

A process for producing the high dielectric composite material according to the second embodiment of the present invention is explained below. In this Example, EP1001 (produced by Yuka Shell Epoxy Co., Ltd.) was used as epoxy resin, dicyandiamide (produced by Wako Pure Chemical Industries, Ltd.) as epoxy resin curing agent, and 2E4MZ-CN (produced by Shikoku Chemicals Corp.) as curing accelerator. Zinc powder having as average particle size of 0.5 μm was used as high dielectric constant material. For the insulation of zinc powder, a phosphate-based chemical treating solution comprising 0.4 mol/l of benzotriazole as rust inhibitor and 0.1% by weight of EF104 (produced by Tohchem Products Corp.) as surfactant was used. S510 (produced by Chisso Corp.) was used as surface treating solution for iron powder after the insulation treatment.

(1) To 1 kg of zinc powder having an average particle size of 0.5 μm, 200 ml of the insulation treating solution was added and the mixture was stirred by a V mixer for 30 minutes and then heated at 180° C. for 60 minutes. A sectional view of the insulated zinc powder is shown in FIG. 1.
(2) The zinc powder after the insulation treatment of (1) was subjected to a surface treatment using an S510 solution diluted to 1% by weight with a water/ethanol mixed solvent, under the conditions of 150° C. and one hour. A sectional view of the surface-treated zinc powder is shown in FIG. 2.
(3) An epoxy resin EP1001 was dissolved in methyl ethyl ketone to a concentration of 70% by weight.
(4) To the methyl ethyl ketone solution of the epoxy resin EP1001 prepared in (3), the zinc powder subjected to the surface treatment of (2) was added in such an amount that it would hold 50% by volume after curing of the resin, and the mixture was kneaded by a three-roll mill. To this mixture, dicyandiamide was added in an amount of 2.5 parts by weight per 100 parts by weight of epoxy resin, followed by further addition of Curesol CN in an amount of 0.1 part by weight per 100 parts by weight of epoxy resin, and the mixture was kneaded by a three-roll mill.
(5) The resulting mixture was desolvated at 100° C. and then heated and cured at 180° C. for 90 minutes to obtain a high dielectric constant composite material of the present invention. A sectional view of the obtained high dielectric constant composite material is shown in FIG. 3.

The dielectric constant, dielectric loss tangent and volume resistivity of this high dielectric constant composite material were determined in the same way as in Example 1. The results are shown in Table 1.

EXAMPLE 3

A process for producing the high dielectric constant composite material according to the third embodiment of the present invention is explained below. In this Example, EP806 (produced by Yuka Shell Epoxy Co., Ltd.) was used as epoxy resin, m-phenylenediamine (produced by Wako Pure Chemical Industries, Ltd.) as epoxy resin curing agent, and 2E4MZ-CN (produced by Shikoku Chemicals Corp.) as curing accelerator. A zinc powder having an average particle size of 3 μm was used as a starting material for the high dielectric constant composite material. For the insulation of the zinc powder, a phosphate-based chemical treating solution containing 0.4 mol/l. of benzotriazole as rust inhibitor and 0.1% by weight of EF104 (produced by Tohchem Products Corp.) as a surfactant was used. S510 (produced by Chisso Corp.) was used as a surface treating solution for the insulated zinc powder.

(1) To 1 kg of zinc powder having an average particle size of 3 µm, 200 ml of the insulating treatment solution was added and the mixture was stirred by a V mixer for 30 minutes, followed by heat treatment at 180° C. for 60 minutes. A cross-sectional view of the zinc powder after the insulation treatment is shown in FIG. 1.

(2) The zinc powder undergone the insulation treatment in above (1) was then subjected to a surface treatment using an S510 solution diluted to 1 wt % concentration with a water/methanol mixed solvent under the conditions of 150° C. for 1 hour. A cross-sectional view of the zinc powder after surface treatment is shown in FIG. 2.

(3) The zinc powder subjected to the surface treatment in above (2) was added to a liquid epoxy resin EP806 in an amount so as to make the zinc powder 50% by volume, followed by kneading by a three-roll mill. To the resulting mixture, m-phenylenediamine was added in an amount equivalent weight to the epoxy resin in relation to the curing reaction, followed by further addition of 2E4MZ-CN in an amount of 0.5 part by weight based on the weight of the epoxy resin. The resulting mixture was kneaded by a three-roll mill.

(4) The mixture obtained in above (3) was heated and cured at 80° C. for 4 hours and at 180° C. for 4 hours to obtain a high dielectric constant composite material of the present invention. A cross-sectional view of the high dielectric constant composite material is shown in FIG. 3.

The dielectric constant, dielectric loss tangent and volume resistivity of the high dielectric constant composite material were measured in the same manner as in Example 1. The results are shown in Table 1.

EXAMPLE 4

A process for producing the high dielectric constant composite material according to the fourth embodiment of the present invention is explained below. In this Example, EP1001 (produced by Yuka Shell Epoxy Co., Ltd.) was used as epoxy resin, dicyandiamide (produced by Wako Pure Chemical Industries, Ltd.) as epoxy resin curing agent, and 2E4MZ-CN (produced by Shikoku Chemicals Corp.) as curing accelerator. A zinc powder having an average particle size of 0.1 µm ground by using a ball mill was used as a starting material for the high dielectric constant composite material. Since the zinc powder was agglomerated, it was sieved with a sieve having an opening of 5 µm so as to pass the agglomerated zinc powder having a maximum particle size of 5 µm or less. For the insulation of the zinc powder, a phosphate-based chemical treating solution containing 0.4 mol/l. of benzotriazole as rust inhibitor and 0.1% by weight of EF104 (produced by Tohchem Products Corp.) as a surfactant was used. S510 (produced by Chisso Corp.) was used as a surface treating solution for the insulated zinc powder.

Figure 4:
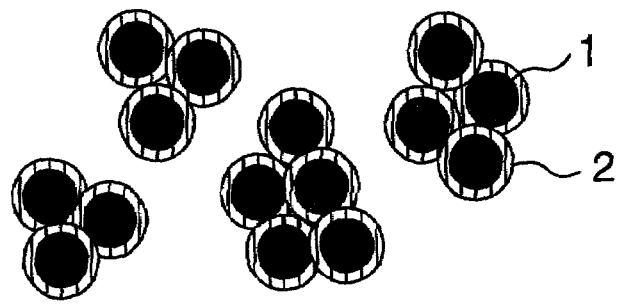
FIG. 4 is a cross-sectional view of the agglomerated metal powder after the insulation treatment in the fourth embodiment of the present invention.

(1) To 1 kg of agglomerated zinc powder having a maximum particle size of 5 µm, 200 ml of the insulating treatment solution was added and the mixture was stirred by a V mixer for 30 minutes, followed by heat treatment at 180° C. for 60 minutes. A cross-sectional view of the zinc powder after the insulation treatment is shown in FIG. 4.

Figure 5:
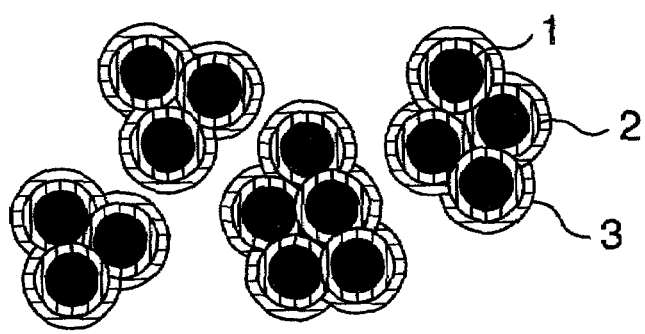
FIG. 5 is a cross-sectional view of the agglomerated metal powder after the surface treatment in the fourth embodiment of the present invention.

(2) The agglomerated zinc powder undergone the insulation treatment in above (1) was then subjected to a surface treatment using an S510 solution diluted to 1 wt % concentration with a water/methanol mixed solvent under the conditions of 150° C. for 1 hour. A cross-sectional view of the zinc powder after surface treatment is shown in FIG. 5.

(3) Epoxy resin EP1001 was dissolved in methyl ethyl ketone so as to make the concentration 70% by weight.

(4) The agglomerated zinc powder subjected to the surface treatment in above (2) was added to the epoxy resin EP1001 dissolved in methyl ethyl ketone in above (3) in an amount so as to make the zinc powder 50% by volume after resin curing, followed by kneading by a three-roll mill. To the resulting mixture, dicyandiamide was added in an amount of 2.5 parts by weight per 100 parts by weight of the epoxy resin, followed by further addition of Curesol CN in an amount of 0.1 part by weight based on 100 parts by weight of the epoxy resin. The resulting mixture was kneaded by a three-roll mill.

Figure 6:
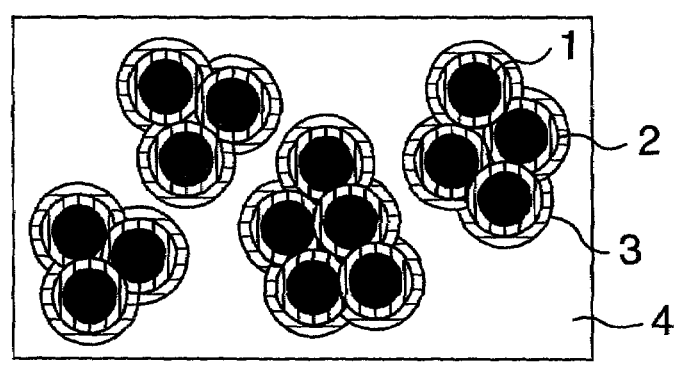
FIG. 6 is a cross-sectional view of the high dielectric constant composite material in the fourth embodiment of the present invention.

(5) The mixture obtained in above (4) was subjected to removal of the solvent at 100° C., and heated and cured at 180° C. for 90 minutes to obtain a high dielectric constant composite material of the present invention. A cross-sectional view of the high dielectric constant composite material is shown in FIG. 6.

The dielectric constant, dielectric loss tangent and volume resistivity of the high dielectric constant composite material were measured in the same manner as in Example 1. The results are shown in Table 1.

EXAMPLE 5

A process for producing the high dielectric constant composite material according to the fifth embodiment of the present invention is explained below. In this Example, EP806 (produced by Yuka Shell Epoxy Co., Ltd.) was used as epoxy resin, m-phenylenediamine (produced by Wako Pure Chemical Industries, Ltd.) as epoxy resin curing agent, and 2E4MZ-CN (produced by Shikoku Chemicals Corp.) as curing accelerator. A copper powder having an average particle size of 1 µm was used as a starting material for the high dielectric constant composite material. For the insulation of the chromium plated zinc powder, a phosphate-based chemical treating solution containing 0.4 mol/l. of benzotriazole as rust inhibitor and 0.1% by weight of EF104 (produced by Tohchem Products Corp.) as a surfactant was used. S510 (produced by Chisso Corp.) was used as a surface treating solution for the insulated copper powder.

Figure 7:
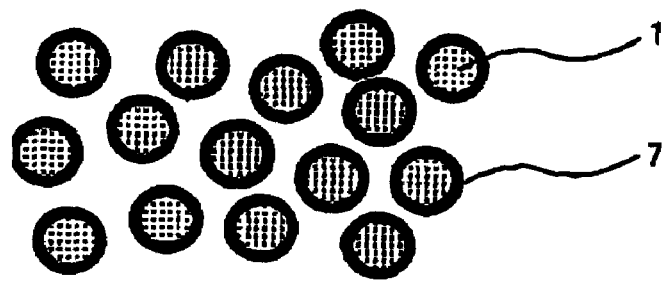
FIG. 7 is a cross-sectional view of the agglomerated metal powder after plating in the fifth embodiment of the present invention.

(1) Chromium plating on the surface of copper powder was conducted by electric plating using a rotating horizontal barrel apparatus. Average plating layer thickness was 10 nm. A cross-sectional view of the metal powder after plating 7 is shown in FIG. 7.

Figure 8:
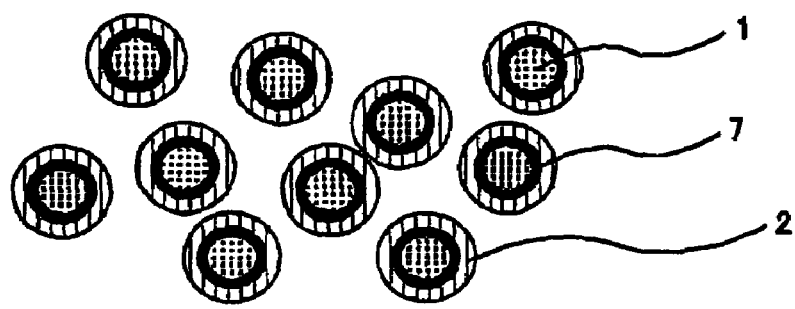
FIG. 8 is a cross-sectional view of the agglomerated metal powder after the insulation treatment in the fifth embodiment of the present invention.

(2) To 1 kg of chromium plated copper powder having an average particle size of 1 µm obtained in above (1), 200 ml of the insulating treatment solution was added and the mixture was stirred by a V mixer for 30 minutes, followed by heat treatment at 180° C. for 60 minutes. A cross-sectional view of the metal powder after the insulation treatment is shown in FIG. 8.

Figure 9:
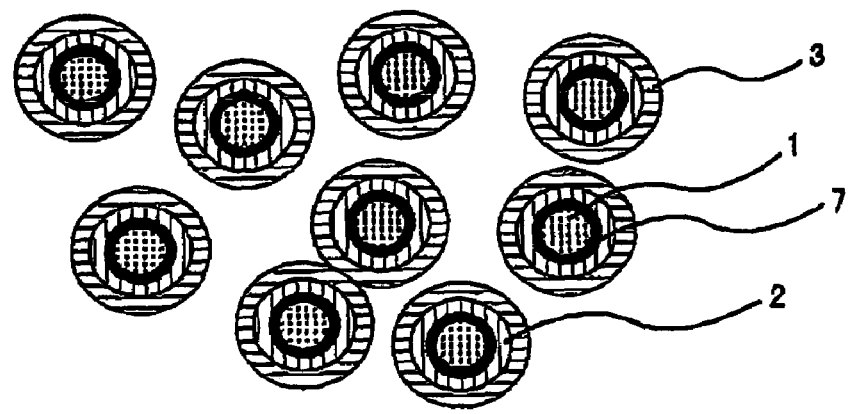
FIG. 9 is a cross-sectional view of the agglomerated metal powder after the surface treatment in the fifth embodiment of the present invention.

(3) The metal powder undergone the insulation treatment in above (2) was then subjected to a surface treatment using an S510 solution diluted to 1 wt % concentration with a water/methanol mixed solvent under the conditions of 150° C. for 1 hour. A cross-sectional view of the metal powder after surface treatment is shown in FIG. 9.

(4) The metal powder subjected to the surface treatment in above (3) was added to the liquid epoxy resin EP806 in an amount so as to make the metal powder 50% by volume, followed by kneading by a three-roll mill. To the resulting mixture, m-phenylenediamine was added in an amount equivalent weight to the epoxy resin in relation to the curing reaction, followed by further addition of Curesol CN in an amount of 0.5 part by weight based on 100 parts by weight of the epoxy resin. The resulting mixture was kneaded by a three-roll mill.

Figure 10:
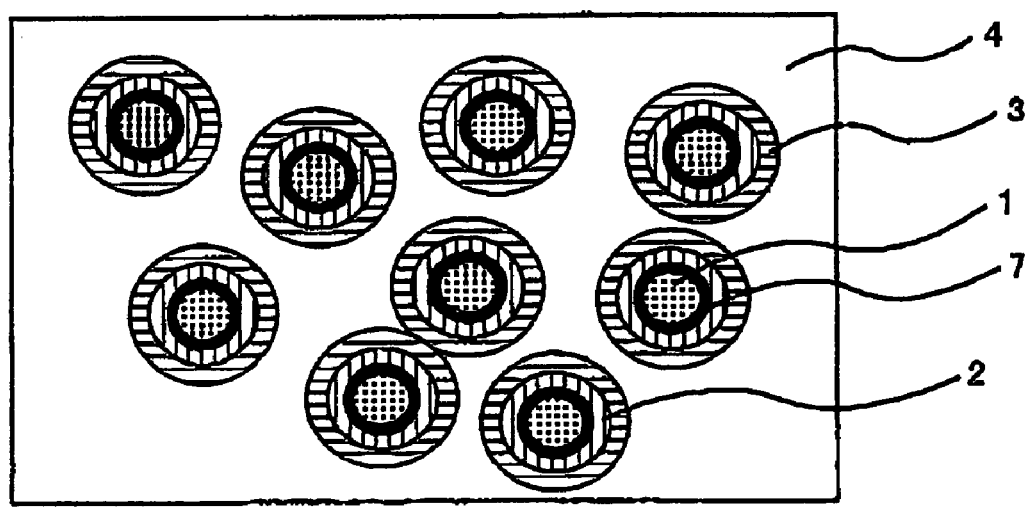
FIG. 10 is a cross-sectional view of the high dielectric constant composite material in the fifth embodiment of the present invention.

(5) The mixture obtained in above (4) was heated and cured at 80° C. for 4 hours and at 180° C. for 4 hours to obtain a high dielectric constant composite material of the present invention. A cross-sectional view of the high dielectric constant composite material is shown in FIG. 10.

The dielectric constant, dielectric loss tangent and volume resistivity of the high dielectric constant composite material were measured in the same manner as in Example 1. The results are shown in Table 1.

EXAMPLE 6

A process for producing the high dielectric constant composite material according to the sixth embodiment of the present invention is explained below. In this Example, EP806 (produced by Yuka Shell Epoxy Co., Ltd.) was used as epoxy resin, m-phenylenediamine (produced by Wako Pure Chemical Industries, Ltd.) as epoxy resin curing agent, and 2E4MZ-CN (produced by Shikoku Chemicals Corp.) as curing accelerator. A chromium powder having an average particle size of 1 μm and an $Al_2O_3$ powder having an average particle size of 0.1 μm were used as a starting material for the high dielectric constant composite material. For the insulation of the chromium powder, a phosphate-based chemical treating solution containing 0.4 mol/l. of benzotriazole as rust inhibitor and 0.1% by weight of EF104 (produced by Tohchem Products Corp.) as a surfactant was used. S510 (produced by Chisso Corp.) was used as a surface treating solution for the insulated chromium powder and $Al_2O_3$ powder.

Figure 11:
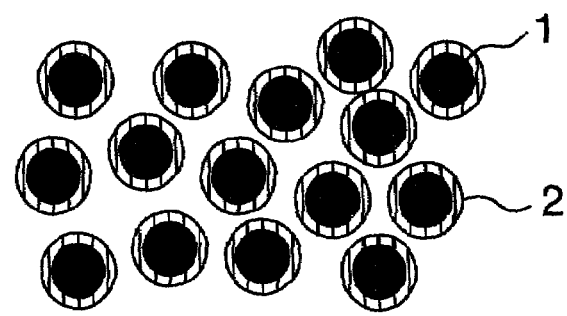
FIG. 11 is a cross-sectional view of the agglomerated metal powder after the insulation treatment in the sixth embodiment of the present invention.

(1) To 1 kg of chromium powder having an average particle size of 1 μm, 200 ml of the insulating treatment solution was added and the mixture was stirred by a V mixer for 30 minutes, followed by heat treatment at 180° C. for 60 minutes. A cross-sectional view of the chromium powder after the insulation treatment is shown in FIG. 11.

Figure 12:
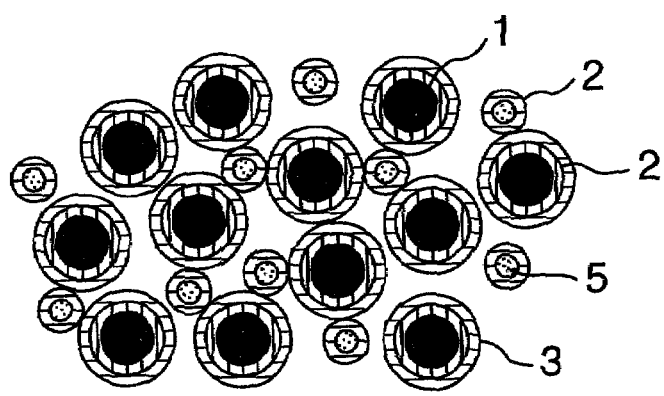
FIG. 12 is a cross-sectional view of the metal/inorganic matter composite powder after the surface treatment in the sixth embodiment of the present invention.

(2) The chromium powder undergone the insulation treatment in above (1) and the $Al_2O_3$ power were then subjected to a surface treatment using an S510 solution diluted to 1 wt % concentration with a water/methanol mixed solvent under the conditions of 150° C. for 1 hour. A cross-sectional view of the chromium powder and $Al_2O_3$ power after surface treatment is shown in FIG. 12.

(3) The chromium powder and $Al_2O_3$ powder (3:1 by volume ratio) subjected to the surface treatment in above (2) was added to the liquid epoxy resin EP806 in an amount so as to make the metal powder 60% by volume, followed by kneading by a three-roll mill. To the resulting mixture, m-phenylenediamine was added in an amount equivalent weight to the epoxy resin in relation to the curing reaction, followed by further addition of 2E4MZ-CN in an amount of 0.5 part by weight based on 100 parts by weight of the epoxy resin. The resulting mixture was kneaded by a three-roll mill.

Figure 13:
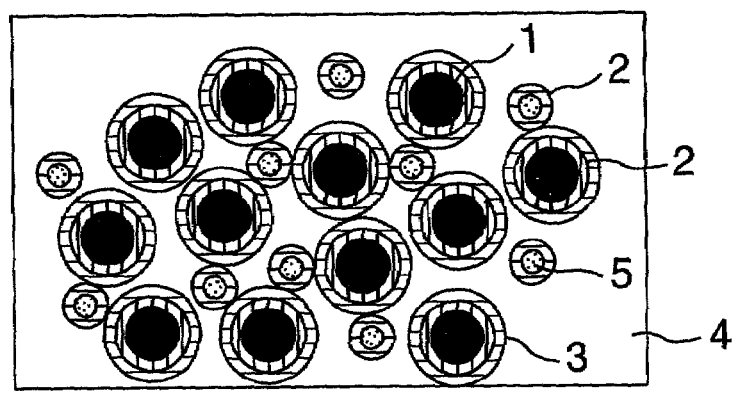
FIG. 13 is a cross-sectional view of the high dielectric constant composite material in the sixth embodiment of the present invention.

(4) The mixture obtained in above (3) was heated and cured at 80° C. for 4 hours and at 180° C. for 4 hours to obtain a high dielectric constant composite material of the present invention. A cross-sectional view of the high dielectric constant composite material is shown in FIG. 13.

The dielectric constant, dielectric loss tangent and volume resistivity of the high dielectric constant composite material were measured in the same manner as in Example 1. The results are shown in Table 1.

EXAMPLE 7

Figure 14:
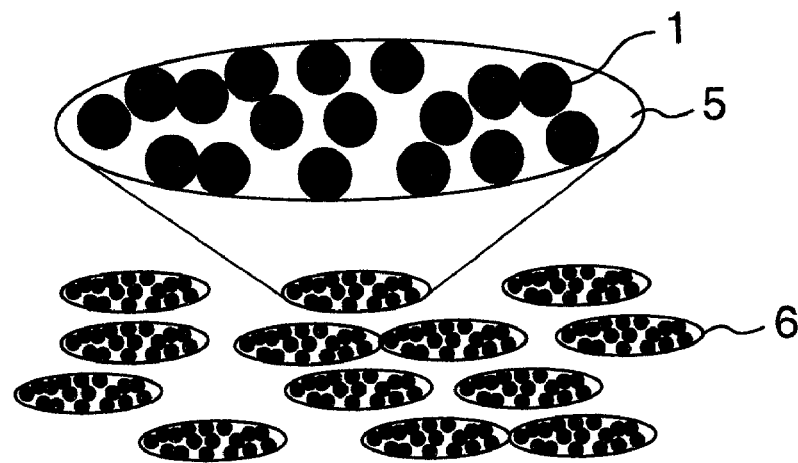
FIG. 14 is a sectional view of the metal/inorganic resin composite powder in the seventh and eighth embodiments of the present invention.

A process for producing the high dielectric constant composite material according to the seventh embodiment of the present invention is described. In this Example, ESCN190-2 (produced by Sumitomo Chemical Co., Ltd.) was used as epoxy resin, H900 (produced by Tohto Kasei Co., Ltd.) as epoxy resin curing agent, and TPP (produced Hokko Chemical Co., Ltd.) as curing accelerator. A flat $Fe/Al_2O_3$ composite powder mixed at the nanometer level was used as high dielectric constant material. The average size of the minor axis of this composite powder was 0.2 μm, and the Fe to $Al_2O_3$ volume ratio was 7:3. A sectional view of the $Fe/Al_2O_3$ composite powder used is shown in FIG. 14. As is seen from FIG. 14, the metal/inorganic matter composite powder according to the instant Example of the present invention has a structure in which the metal powder particles 1 are integrated with the inorganic matter 5. A phosphate-based chemical treating solution comprising 0.4 mol/l of benzotriazole as rust inhibitor and 0.1% by weight of EF104 (produced by Tohchem Products Corp.) as surfactant was used for the insulation of the $Fe/Al_2O_3$ composite powder. S510 (produced by Chisso Corp.) was used as the surface treating solution for the iron powder after the insulation treatment.

Figure 15:
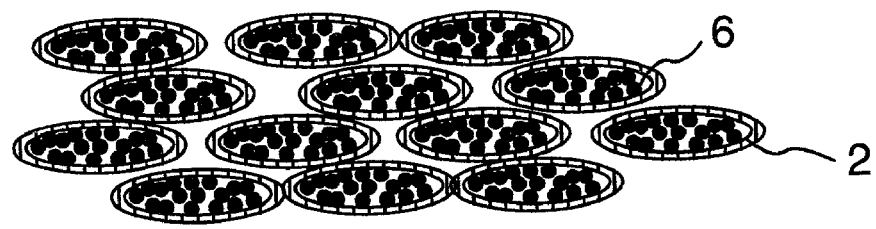
FIG. 15 is a sectional view of the metal/inorganic matter composite powder after the insulation treatment in the seventh and eighth embodiments of the present invention.

(1) To 1 kg of the $Fe/Al_2O_3$ composite powder, 200 ml of the insulation treating solution was added, and the mixture was stirred by a V mixer for 30 minutes and then heated at 180° C. for 60 minutes. A sectional view of the $Fe/Al_2O_3$ composite powder after the insulation treatment is shown in FIG. 15. As is seen from FIG. 15, this composite powder is of a structure in which the surface of each composite powder particle 6 is coated with an insulating film 2.

Figure 16:
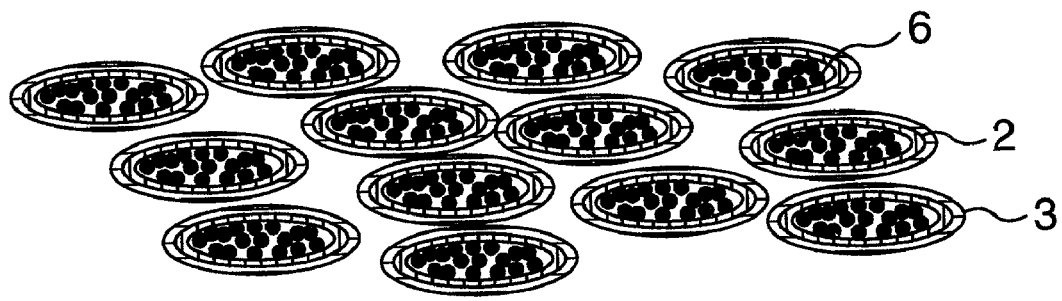
FIG. 16 is a sectional view of the metal/inorganic matter composite powder after the surface treatment in the seventh and eighth embodiments of the present invention.

(2) The $Fe/Al_2O_3$ composite powder which had gone through the insulation treatment of (1) was subjected to a surface treatment using an S510 solution diluted to a concentration of 1% by weight with a water/ethanol mixed solvent, under the conditions of 150° C. and one hour. A sectional view of the $Fe/Al_2O_3$ composite powder after the surface treatment is shown in FIG. 16. In this composite powder, as is seen from FIG. 16, the surface of the insulating film 2 is further coated with a surface film 3.

(3) An epoxy resin ESCN190-2 and a curing agent H100 were dissolved in methyl ethyl ketone, each to a concentration of 70% by weight.

(4) To the methyl ethyl ketone solution of the epoxy resin ESCN190-2 prepared in (3), the $Fe/Al_2O_3$ composite powder which had undergone the surface treatment of (2) was added to have a concentration of 50% by volume after curing of the resin, and the mixture was kneaded by a three-roll mill. To this mixture, H100 was added in an amount making it equivalent to the epoxy resin in relation to the curing reaction, followed by further addition of TPP in an amount of 0.4 part by weight per 100 parts by weight of the epoxy resin, and the mixture was kneaded by a three-roll mill.

Figure 17:
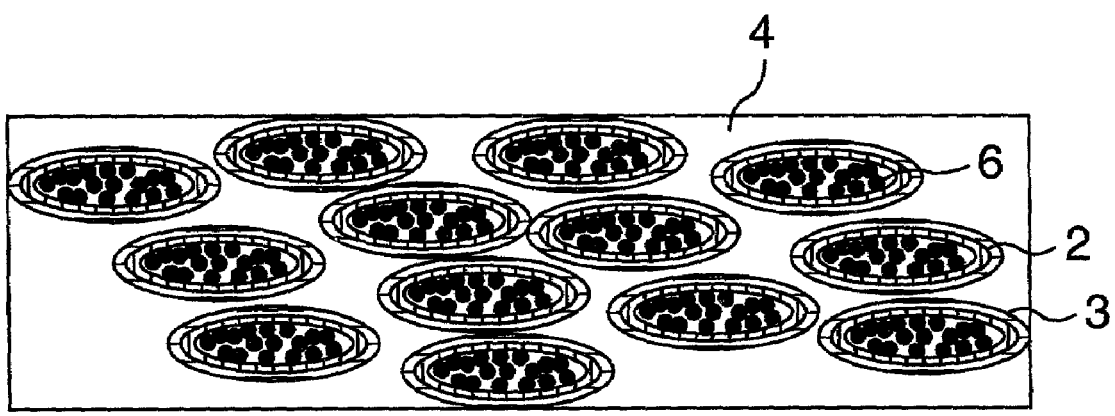
FIG. 17 is a sectional view of the high dielectric composite material in the seventh and eighth embodiments of the present invention.

(5) The mixture prepared in (4) was desolvated at 90° C. and then heated and cured at 180° C. for 6 hours to obtain a high dielectric constant composite material of the present invention. A sectional view of this high dielectric constant composite material is shown in FIG. 17, from which it will be seen that the high dielectric constant composite material of this embodiment is of a structure in which an inorganic filler comprising a metal/inorganic matter composite powder with its surface coated with an insulation layer 2, said insulation layer being further coated with a surface film 3, is dispersed in a resin 4.

The dielectric constant, dielectric loss tangent and volume resistivity of this high dielectric constant composite material were determined in the same way as in Example 1. The results are shown in Table 1.

EXAMPLE 8

A process for producing the high dielectric constant composite material according to the eighth embodiment of the present invention is explained. In this Example, there were used Epikote 828 (produced by Yuka Shell Epoxy Co., Ltd.) as epoxy resin, m-phenylenediamine (produced by Wako Pure Chemical Industries, Ltd.) as epoxy resin curing agent, and 2E4MZ-CN (produced by Shikoku Chemicals Corp.) as curing accelerator. A flat $Fe/BaTiO_3$ composite powder mixed at the nanometer level was used as high dielectric constant material. The average size of the minor axis of this composite powder was 0.2 μm, and the Fe to $BaTiO_3$ volume ratio was 7:3. A sectional view of the $Fe/BaTiO_3$ composite powder used is shown in FIG. 14. A phosphate-based chemical treating solution comprising 0.4 mol/l of benzotriazole as rust inhibitor and 0.1% by weight of EF104 (produced by Tohchem Products Corp.) as surfactant was used for the insulation of the $Fe/BaTiO_3$ composite powder. S510 (produced by Chisso Corp.) was used as the surface treating solution for the insulated iron powder.

(1) To 1 kg of $Fe/BaTiO_3$ composite powder, 200 ml of the insulation treatment solution was added and the mixture was stirred by a V mixer for 30 minutes and then heated at 180° C. for 60 minutes. A sectional view of the $Fe/BaTiO_3$ composite powder after the insulation treatment is shown in FIG. 15.

(2) The $Fe/BaTiO_3$ composite powder which had undergone the insulation treatment of (1) was then subjected to a surface treatment with an S510 solution diluted to 1 wt % concentration with a water/methanol mixed solvent, under the conditions of 150° C. and one hour. A sectional view of the $Fe/TaTiO_3$ composite powder after the surface treatment is shown in FIG. 16.

(3) To a liquid epoxy resin EP828, the $Fe/BaTiO_3$ composite powder subjected to the surface treatment of (2) was added in such an amount as to hold 50% by volume and the mixture was kneaded by a three-roll mill. To the kneaded mixture, m-phenylenediamine was added in an amount making it equivalent to the epoxy resin in relation to the curing reaction, followed by further addition of 2E4MZ-CN in an amount of 0.5 part by weight based on the epoxy resin and the mixture was kneaded by a three-roll mill.

(4) The mixture obtained in (3) was heated and cured at 80° C. for 4 hours and then at 180° C. for 4 hours to obtain a high dielectric constant composite material of the present invention. A sectional view of this high dielectric constant composite material is shown in FIG. 17.

The dielectric constant, dielectric loss tangent and volume resistivity of this high dielectric constant composite material were determined in the same way as in Example 1. The results are shown in Table 1.

The results of Examples 1 to 8 confirm that the substrates made by using the high dielectric constant composite material of the present invention characteristically have a high dielectric constant, a low dielectric loss tangent and a high volume resistivity, and thus are possessed of the advantageous properties as a substrate having a built-in filter, A/D converter, terminals, decoupling condenser, energy storing condenser or such.

Comparative Example 1

A process for producing the organic resin/metal composite material according to the first comparative example is explained. In this comparative example, there were used EP828 (produced by Yuka Shell Epoxy Co., Ltd.) as epoxy resin, m-phenylenediamine (produced by Wako Pure Chemical Industries, Ltd.) as epoxy resin curing agent, and 2E4MZ-CN (produced by Shikoku Chemicals Corp.) as curing accelerator. Iron powder having an average particle size of 5 μm was used as a starting material for organic resin/mineral constant material. For the insulation of iron powder, a phosphate-based chemical treating solution containing 0.4 mol/l of benzotriazole as rust inhibitor and 0.1% by weight of EF104 (produced by Tohchem Products Corp.) as surfactant was used. S510 (produced by Chisso Corp.) was used as surface treating solution for iron powder after the insulation treatment.

(1) To 1 kg of iron powder having an average particle size of 5 μm, 200 ml of the insulating treatment solution was added and the mixture was stirred by a V mixer for 30 minutes and then heated at 180° C. for 60 minutes.

(2) The iron powder which had undergone the insulation treatment of (1) was then subjected to a surface treatment with an S510 solution diluted to 1 wt % concentration with a water/methanol mixed solvent, under the conditions of 150° C. and one hour.

(3) To a liquid epoxy resin EP828, the iron powder subjected to the surface treatment of (2) was added in such an amount as to hold 50% by volume and the mixture was kneaded by a three-roll mill. To the kneaded mixture, m-phenylenediamine was added in an amount making it equivalent to the epoxy resin in relation to the curing reaction, followed by further addition of 2E4MZ-CN in an amount of 0.5 part by weight based on the epoxy resin and the mixture was kneaded by a three-roll mill.

(4) The mixture obtained in (3) was heated and cured at 80° C. for 4 hours and then at 180° C. for 4 hours to obtain an organic resin/metal composite material.

The dielectric constant, dielectric loss and volume resistivity of the obtained organic resin/metal composite material were determined in the same way as in Example 1. The results are shown in Table 1.

The results show that although this organic resin/metal composite material has a satisfactory dielectric constant and volume resistivity, it suffers an intolerably high dielectric loss tangent and is unsuited for use as a substrate material.

Comparative Example 2

A process for producing the organic resin/metal composite material according to the second comparative example is explained. In this second comparative example, EP1001 (produced by Yuka Shell Epoxy Co., Ltd.) was used as epoxy resin, dicyandiamide (produced by Wako Pure Chemical Industries, Ltd.) as epoxy resin curing agent, and 2E4MZ-CN (produced by Shikoku Chemicals Corp.) as curing accelerator. Zinc powder having an average particle size of 0.5 μm was used as a starting material for the organic resin/metal composite material. S510 (produced by Chisso Corp.) was used as surface treating solution for zinc powder.
(1) The zinc powder was surface treated using an S510 solution diluted to 1% by weight with a water/ethanol mixed solvent, under the conditions of 150° C. and one hour.
(2) An epoxy resin EP1001 was dissolved in methyl ethyl ketone to a concentration of 70% by weight.
(3) To the methyl ethyl ketone solution of epoxy resin EP1001 prepared in (2), the zinc powder subjected to the surface treatment of (2) was added in such an amount that it would hold 50% by volume after curing of the resin, and the mixture was kneaded by a three-roll mill. To this mixture, dicyandiamide was added in an amount of 2.5 parts by weight per 100 parts by weight of epoxy resin, followed by further addition of Curesol CN in an amount of 0.1 part by weight per 100 parts by weight of epoxy resin, and the mixture was kneaded by a three-roll mill.
(4) The resulting mixture was desolvated at 100° C. and then heated and cured at 180° C. for 90 minutes to produce an organic resin/metal composite material of the present comparative example.

The dielectric constant, dielectric loss and volume resistivity of this organic resin/metal composite material were determined in the same way as in Example 1. The results are shown in Table 1.

The results show that although this organic resin/metal composite material has a satisfactory dielectric constant, it suffers a high dielectric loss tangent and also exhibits a large volume resistivity, so that it is unsuited for use as a substrate material.

Comparative Example 3

A process for producing the organic resin/metal composite material according to the third comparative example is explained below. In this Comparative Example, EP806 (produced by Yuka Shell Epoxy Co., Ltd.) was used as epoxy resin, m-phenylenediamine (produced by Wako Pure Chemical Industries, Ltd.) as epoxy resin curing agent, and 2E4MZ-CN (produced by Shikoku Chemicals Corp.) as curing accelerator. A zinc powder having an average particle size of 20 μm was used as a starting material for the organic resin/metal composite material. For the insulation of the zinc powder, a phosphate-based chemical treating solution containing 0.4 mol/l. of benzotriazole as rust inhibitor and 0.1% by weight of EF104 (produced by Tohchem Products Corp.) as a surfactant was used. S510 (produced by Chisso Corp.) was used as a surface treating solution for the insulated zinc powder.
(1) To 1 kg of zinc powder having an average particle size of 20 μm, 200 ml of the insulating treatment solution was added and the mixture was stirred by a V mixer for 30 minutes, followed by heat treatment at 180° C. for 60 minutes.
(2) The zinc powder undergone the insulation treatment in above (1) was then subjected to a surface treatment using an S510 solution diluted to 1 wt % concentration with a water/methanol mixed solvent under the conditions of 150° C. for 1 hour.
(3) The zinc powder subjected to the surface treatment in above (2) was added to the liquid epoxy resin EP806 in an amount so as to make the metal powder 50% by volume, followed by kneading by a three-roll mill. To the resulting mixture, m-phenylenediamine was added in an amount equivalent weight to the epoxy resin in relation to the curing reaction, followed by further addition of 2E4MZ-CN in an amount of 0.5 part by weight based on 100 parts by weight of the epoxy resin. The resulting mixture was kneaded by a three-roll mill.
(4) The mixture obtained in above (3) was heated and cured at 80° C. for 4 hours and at 180° C. for 4 hours to obtain the organic resin/metal composite material of this Comparative Example.

The dielectric constant, dielectric loss tangent and volume resistivity of the organic resin/metal composite material of this Comparative Example were measured in the same manner as in Example 1. The results are shown in Table 1.

The results show that this organic resin/metal composite material has good value as to the volume resistivity, but has a small dielectric constant and a large dielectric loss tangent. Thus, this composite material is not suitable as a high dielectric constant substrate material.

Comparative Example 4

A process for producing the organic resin/metal composite material according to the fourth comparative example is explained below. In this Comparative Example, EP1001 (produced by Yuka Shell Epoxy Co., Ltd.) was used as epoxy resin, dicyandiamide (produced by Wako Pure Chemical Industries, Ltd.) as epoxy resin curing agent, and 2E4MZ-CN (produced by Shikoku Chemicals Corp.) as curing accelerator. A zinc powder having an average particle size of 0.1 μm ground by using a ball mill was used as a starting material for the organic resin/metal composite material. Since the zinc powder was agglomerated, it was sieved with a sieve having an opening of 5 μm so as to pass the agglomerated zinc powder having a maximum particle size of 5 μm or less. For the insulation of the zinc powder, a phosphate-based chemical treating solution containing 0.4 mol/l. of benzotriazole as rust inhibitor and 0.1% by weight of EF104 (produced by Tohchem Products Corp.) as a surfactant was used. S510 (produced by Chisso Corp.) was used as a surface treating solution for the insulated zinc powder.
(1) To 1 kg of agglomerated zinc powder having a maximum particle size of 50 μm, 200 ml of the insulating treatment solution was added and the mixture was stirred by a V mixer for 30 minutes, followed by heat treatment at 180° C. for 60 minutes.
(2) The agglomerated zinc powder undergone the insulation treatment in above (1) was then subjected to a surface treatment using an S510 solution diluted to 1 wt % concentration with a water/methanol mixed solvent under the conditions of 150° C. for 1 hour.
(3) Epoxy resin EP 1001 was dissolved with methyl ethyl ketone as so to make the concentration 70% by weight.
(4) The agglomerated zinc powder subjected to the surface treatment in above (2) was added to the epoxy resin EP1001 dissolved in methyl ethyl ketone in above (3) in an amount so as to make the metal powder 50% by volume after resin curing, followed by kneading by a three-roll mill. To the resulting mixture, dicyandiamide was added in an amount of 2.5 parts by weight per 100 parts by weight of the epoxy resin, followed by further addition of Curesol CN in an amount of 0.1 part by weight per 100 parts by weight of the epoxy resin. The resulting mixture was kneaded by a three-roll mill.
(5) The mixture obtained in above (4) was subjected to removal of the solvent at 100° C., and heated and cured at 180° C. for 90 minutes to obtain the organic resin/metal composite material of this Comparative Example.

The dielectric constant, dielectric loss tangent and volume resistivity of the organic resin/metal composite material of this Comparative Example were measured in the same manner as in Example 1. The results are shown in Table 1.

The results show that this organic resin/metal composite material has good value as to the volume resistivity, but has a small dielectric constant and a large dielectric loss tangent. Thus, this composite material is not suitable as a high dielectric constant substrate material.

Comparative Example 5

A process for producing the organic resin/metal composite material according to the fifth comparative example is explained below. In this Comparative Example, EP806 (produced by Yuka Shell Epoxy Co., Ltd.) was used as epoxy resin, m-phenylenediamine (produced by Wako Pure Chemical Industries, Ltd.) as epoxy resin curing agent, and 2E4MZ-CN (produced by Shikoku Chemicals Corp.) as curing accelerator. A copper powder having an average particle size of 1 μm was used as a starting material for the organic resin/metal composite material. S510 (produced by Chisso Corp.) was used as a surface treating solution for the chromium plated copper powder.
(1) Chromium plating on the surface of copper powder was conducted by electric plating using a rotating horizontal barrel apparatus. Average plating layer thickness was 10 nm.
(2) The chromium plated copper powder obtained in above (1) was subjected to surface treatment using S510 treating solution with a concentration of 1% by weight diluted with a water/methanol mixed solution at 150° C. for 1 hour.
(3) The metal powder subjected to the surface treatment in above (2) was added to the liquid epoxy resin EP806 in an amount so as to make the metal powder 50% by volume, followed by kneading by a three-roll mill. To the resulting mixture, m-phenylenediamine was added in an amount equivalent weight to the epoxy resin in relation to the curing reaction, followed by further addition of 2E4MZ-CN in an amount of 0.5 part by weight based on 100 parts by weight of the epoxy resin. The resulting mixture was kneaded by a three-roll mill.
(4) The mixture obtained in above (3) was heated and cured at 80° C. for 4 hours and at 180° C. for 4 hours to obtain the organic resin/metal composite material of this Comparative Example.

The dielectric constant, dielectric loss tangent and volume resistivity of the organic resin/metal composite material of this Comparative Example were measured in the same manner as in Example 1. The results are shown in Table 1.

The results show that this organic resin/metal composite material has good value as to the dielectric constant, but has a large dielectric loss tangent and a small volume resistivity. Thus, this composite material is not suitable as a substrate material.

Comparative Example 6

A process for producing the organic resin/metal composite material according to the sixth comparative example is explained below. In this Comparative Example, EP806 (produced by Yuka Shell Epoxy Co., Ltd.) was used as epoxy resin, m-phenylenediamine (produced by Wako Pure Chemical Industries, Ltd.) as epoxy resin curing agent, and 2E4MZ-CN (produced by Shikoku Chemicals Corp.) as curing accelerator. A chromium powder having an average particle size of 1 μm and an $Al_2O_3$ powder having an average particle size of 0.1 μm were used as a starting material for the organic resin/metal composite material. For the insulation of the chromium powder, a phosphate-based chemical treating solution containing 0.4 mol/l. of benzotriazole as rust inhibitor and 0.1% by weight of EF104 (produced by Tohchem Products Corp.) as a surfactant was used.
(1) To 1 kg of chromium powder having an average particle size of 1 μm, 200 ml of the insulating treatment solution was added and the mixture was stirred by a V mixer for 30 minutes, followed by heat treatment at 180° C. for 60 minutes.
(2) The chromium powder subjected to insulation treatment in above (1) and $Al_2O_3$ powder (3:1 by volume ratio) was added to the liquid epoxy resin EP806 in an amount so as to make the metal powder 60% by volume, followed by kneading by a three-roll mill. To the resulting mixture, m-phenylenediamine was added in an amount equivalent weight to the epoxy resin in relation to the curing reaction, followed by further addition of 2E4MZ-CN in an amount of 0.5 part by weight based on 100 parts by weight of the epoxy resin. The resulting mixture was kneaded by a three-roll mill. But the organic resin/metal composite material of this Comparative Example was not possible to mix uniform.

As a result, it was revealed that the organic resin/metal composition material of this Comparative Example was not suitable for a high dielectric constant substrate.

Comparative Example 7

A process for producing the organic resin/metal composite material according to the seventh comparative example of the present invention is described. In this comparative example, ESCN190-2 (produced by Sumitomo Chemical Co., Ltd.) was used as epoxy resin, H900 (produced by Tohto Kasei Co., Ltd.) as epoxy resin curing agent, and TPP (produced Hokko Chemical Co., Ltd.) as curing accelerator. A spherical $Fe/Al_2O_3$ composite powder was used as a starting material for the organic resin/metal composite material. The average size of this composite powder was 10 μm, and the Fe to $Al_2O_3$ volume ratio was 7:3. A phosphate-based chemical treating solution comprising 0.4 mol/l of benzotriazole as rust inhibitor and 0.1% by weight of EF104 (produced by Tohchem Products Corp.) as surfactant was used for the insulation of the $Fe/Al_2O_3$ composite powder. S510 (produced by Chisso Corp.) was used as the surface treating solution for the insulated iron powder.
(1) To 1 kg of the $Fe/Al_2O_3$ composite powder, 200 ml of the insulation treating solution was added, and the mixture was stirred by a V mixer for 30 minutes and then heated at 180° C. for 60 minutes.
(2) The $Fe/Al_2O_3$ composite powder which had gone through the insulation treatment of (1) was subjected to a surface treatment using an S510 solution diluted to a concentration of 1% by weight with a water/ethanol mixed solvent, under the conditions of 150° C. and one hour.
(3) An epoxy resin ESCN190-2 and a curing agent H900 were dissolved in methyl ethyl ketone, each to a concentration of 70% by weight.
(4) To the methyl ethyl ketone solution of the epoxy resin ESCN190-2 prepared in (3), the $Fe/Al_2O_3$ composite powder which had undergone the surface treatment of (2) was added to have a concentration of 50% by volume after curing of the resin, and the mixture was kneaded by a three-roll mill. To this mixture, H900 was added in an amount making it equivalent to the epoxy resin in relation to the curing reaction, followed by further addition of TPP in an amount of 0.4 part by weight per 100 parts by weight of the epoxy resin, and the mixture was kneaded by a three-roll mill.

(5) The mixture prepared in (4) was desolvated at 90° C. and then heated and cured at 180° C. for 6 hours to obtain an organic resin/metal composite material.

The dielectric constant, dielectric loss and volume resistivity of this organic resin/metal composite material were determined in the same way as in Example 1. The results are shown in Table 1.

The results show that although the organic resin/metal composite material of this comparative example is satisfactory in dielectric constant and volume resistivity, it suffers a high dielectric loss tangent and is unsuited for use as a substrate material.

Comparative Example 8

A process for producing an organic resin/metal composite material according to the eighth comparative example is explained. In this comparative example, there were used Epikote 828 (produced by Yuka Shell Epoxy Co., Ltd.) as epoxy resin, m-phenylenediamine (produced by Wako Pure Chemical Industries, Ltd.) as epoxy resin curing agent, and 2E4MZ-CN (produced by Shikoku Chemicals Corp.) as curing accelerator. A flat $Fe/BaTiO_3$ composite powder mixed at the nanometer level was used as a starting material for the organic resin/metal composite material. The average size of the minor axis of this composite powder was 0.2 μm, and the Fe to $BaTiO_3$ volume ratio was 7:3. S510 (produced by Chisso Corp.) was used as the surface treating solution for the iron powder after insulation.

(1) The $Fe/BaTiO_3$ composite powder was subjected to a surface treatment with an S510 solution diluted to 1 wt % concentration with a water/methanol mixed solvent, under the conditions of 150° C. and one hour.

(2) To a liquid epoxy resin EP828, the $Fe/BaTiO_3$ composite powder subjected to the surface treatment of (1) was added in such an amount as to hold 50% by volume and the mixture was kneaded by a three-roll mill. To the kneaded mixture, m-phenylenediamine was added in an amount making it equivalent to the epoxy resin in relation to the curing reaction, followed by further addition of 2E4MZ-CN in an amount of 0.5 part by weight based on the epoxy resin and the mixture was kneaded by a three-roll mill.

(3) The mixture obtained in (2) was heated and cured at 80° C. for 4 hours and then at 180° C. for 4 hours to obtain an organic resin/metal composite material.

The dielectric constant, dielectric loss tangent and volume resistivity of this organic resin/metal composite material were determined in the same way as in Example 1. The results are shown in Table 1.

The results show that although the organic resin/metal composite material of this comparative example had a satisfactory dielectric constant, it was high in dielectric loss tangent and low in volume resistivity, and was therefore unsuited for use as a substrate material.

The high dielectric constant composite material according to the present invention comprises an organic resin having filled therein a metal powder of a submicron size which was subjected to a chemical insulating treatment with an inorganic salt and surface treatment in order to improve compatibility with the organic resin, so that it has a dielectric constant of 15 or above and suffers a dielectric loss tangent of only 0.1 or less even in the frequency range of the GHz order.

The substrates using the high dielectric constant composite material of the present invention typically have a high dielectric constant and demonstrate a low dielectric loss tangent and a high volume resistivity, so that they are possessed of the advantageous properties in use as a substrate having a built-in filter, A/D converter, decoupling condenser, energy storing condenser or such.

It will be further understood by those skilled in the art that the foregoing description has been made on embodiments of the invention and that various changes and modifications may be made in the invention without departing from the spirit of the invention and the scope of the appended claims.

What is claimed is:

1. A high dielectric constant composite material having a dielectric constant of 15 or above in the frequency region of from 100 MHz to 40 GHz, comprising:
an organic resin and, dispersed therein, an inorganic filler, wherein
the inorganic filler comprises a composite filler comprising a core metal powder particle having an average particle size of 5 μm or less or a core agglomerate of metal powder particles having an average agglomerate size of 5 μm or less;
an insulating film covering the core; and
a surface treatment film covering the insulating film, the surface treatment film being chemically bonded to the insulating film and the organic resin.

2. A high dielectric constant composite material according to claim 1, wherein the composite material has a dielectric loss tangent in the frequency region of from 100 MHz to 80 GHz of 0.1 or less.

3. A high dielectric constant composite material according to claim 1, wherein the core of the composite filler further comprises a metallic covering layer on the surface thereof with a thickness of 1000 to 1 nm, wherein the metallic covering layer comprises at least one metal selected from the group consisting of Cr, Cd, Zn, Mn and Fe.

4. A high dielectric constant composite material according to claim 1, wherein said insulating layer is provided by chemical treatment using an inorganic salt.

5. A high dielectric constant composite material according to claim 4, wherein said metal powder is powder of Al, Mn, Si, Mg, Cr, Nb, Ni, Mo, Cu, Fe, W, Zn, Sn, Pb, Ag, Ti, Zr, Ta, Pt, Sb or an alloy thereof.

6. A high dielectric constant composite material according to claim 1, wherein the inorganic filler further comprises a metal oxide mixed with the composite filler.

7. A high dielectric constant composite material according to claim 1, wherein said metal powder is a powder of an element of Group 1B, 2B, 3B, 4B, 5B, 6B, 7B, 8, 2A, 3A, 4A or 5A (excluding boron, carbon, nitrogen, phosphorus and arsenic) or an alloy thereof.

* * * * *